(12) United States Patent
Wright

(10) Patent No.: US 8,207,798 B1
(45) Date of Patent: Jun. 26, 2012

(54) MATCHING NETWORK WITH SWITCHABLE CAPACITOR BANK

(75) Inventor: Peter V. Wright, Portland, OR (US)

(73) Assignee: Triquint Semiconductor, Inc., Hillsboro, OR (US)

( * ) Notice: Subject to any disclaimer, the term of this patent is extended or adjusted under 35 U.S.C. 154(b) by 378 days.

(21) Appl. No.: 12/556,385

(22) Filed: Sep. 9, 2009

(51) Int. Cl.
*H03H 7/38* (2006.01)
(52) U.S. Cl. .................... 333/32; 333/17.3
(58) Field of Classification Search .............. 333/32, 333/33, 17.3; 330/302, 305, 286
See application file for complete search history.

(56) References Cited

U.S. PATENT DOCUMENTS

| | | | |
|---|---|---|---|
| 5,152,004 A | 9/1992 | Vaisanen | |
| 5,276,912 A | 1/1994 | Siwiak | |
| 5,361,403 A | 11/1994 | Dent | |
| 5,423,074 A | 6/1995 | Dent | |
| 5,530,923 A | 6/1996 | Heinonen | |
| 5,564,086 A | 10/1996 | Cygan | |
| 5,661,434 A | 8/1997 | Brozovich | |
| 5,758,269 A | 5/1998 | Wu | |
| 5,774,017 A | 6/1998 | Adar | |
| 5,808,527 A * | 9/1998 | De Los Santos | 333/205 |
| 5,909,643 A | 6/1999 | Aihara | |
| 6,020,787 A | 2/2000 | Kim | |
| 6,043,721 A | 3/2000 | Nagode | |
| 6,069,525 A | 5/2000 | Sevic | |
| 6,069,526 A | 5/2000 | Ballantyne | |
| 6,242,986 B1 | 6/2001 | Adar | |
| 6,271,722 B1 | 8/2001 | Ballantyne | |
| 6,288,608 B1 | 9/2001 | Jadus | |
| 6,313,700 B1 | 11/2001 | Nishijima | |
| 6,377,117 B2 | 4/2002 | Oskowsky | |
| 6,496,061 B1 | 12/2002 | Bloom | |
| 6,501,331 B2 | 12/2002 | Adar | |
| 6,515,541 B2 | 2/2003 | Cheng | |
| 6,522,201 B1 | 2/2003 | Hsiao | |
| 6,603,359 B2 | 8/2003 | Fujiwara | |
| 6,700,439 B2 | 3/2004 | Jackson | |
| 6,781,455 B2 | 8/2004 | Kim | |
| 6,794,935 B2 | 9/2004 | Klomsdorf | |
| 6,806,767 B2 | 10/2004 | Dow | |
| 6,900,692 B2 | 5/2005 | Kim | |
| 6,972,618 B2 | 12/2005 | Kim | |
| 6,992,543 B2 * | 1/2006 | Luetzelschwab et al. | 333/32 |
| 7,142,829 B2 | 11/2006 | Sung | |
| 7,157,966 B2 | 1/2007 | Baree | |
| 8,026,773 B2 * | 9/2011 | Zhu et al. | 333/32 |
| 8,107,917 B2 * | 1/2012 | Russell et al. | 455/290 |
| 2005/0083117 A1 | 4/2005 | Kim | |
| 2005/0099227 A1 | 5/2005 | Kim | |
| 2007/0096804 A1 | 5/2007 | Bakalski | |
| 2007/0096810 A1 | 5/2007 | Hageman | |
| 2011/0227666 A1 * | 9/2011 | Manssen et al. | 333/32 |
| 2011/0304408 A1 * | 12/2011 | McKinzie, III | 333/32 |

OTHER PUBLICATIONS

U.S. Appl. No. 12/414,495, filed Mar. 30, 2009.

* cited by examiner

*Primary Examiner* — Stephen Jones
(74) *Attorney, Agent, or Firm* — Schwabe Williamson & Wyatt

(57) ABSTRACT

Embodiments of circuits, apparatuses, and systems for a matching network having a switchable capacitor bank are disclosed. Other embodiments may be described and claimed.

24 Claims, 11 Drawing Sheets

MATCHING NETWORK WITH SWITCHABLE CAPACITOR BANK

FIELD

Embodiments of the present disclosure relate generally to the field of circuits, and more particularly to a matching network with a switchable capacitor bank.

BACKGROUND

Amplification circuitry within cellular phones often has to account for varying transmit power requirements. These varying requirements may result in the amplification circuitry providing different transmit powers for different operational conditions of the cellular phones, e.g., the mode or frequency range in which the cellular phone is operating, distance from a base station, etc. In order for the amplification circuitry to operate efficiently across a range of transmit powers, with a fixed supply voltage, the amplification circuitry may include a matching network that is capable of providing a varying impedance transformation.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Figure 1:
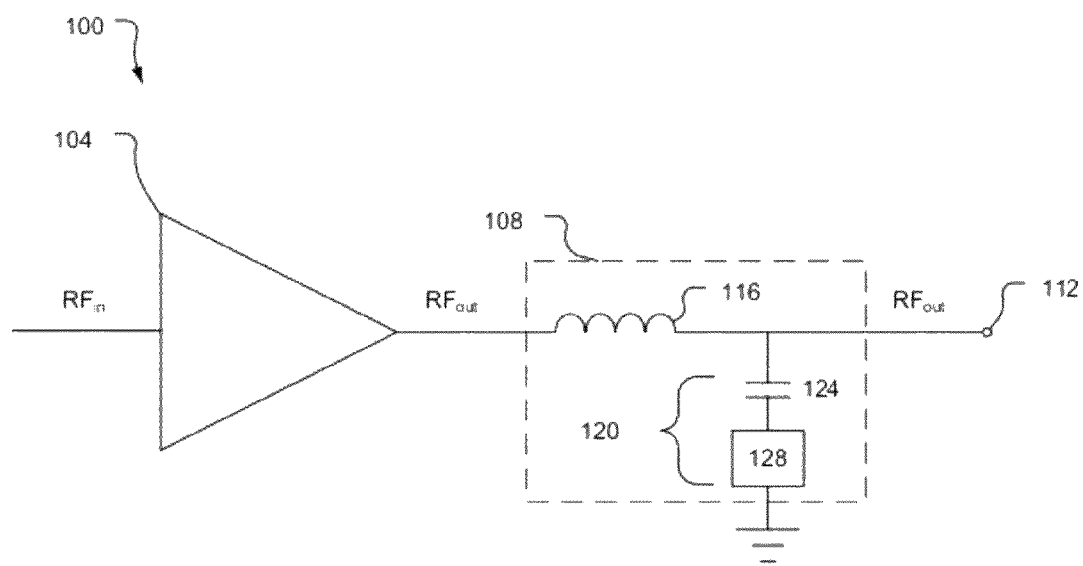
FIG. 1 illustrates amplification circuitry in accordance with various embodiments.

FIG. 1 illustrates amplification circuitry 100 in accordance with some embodiments of the present disclosure. The amplification circuitry 100 generally includes a power amplifier 104 coupled with a matching network 108, which is, in turn, coupled with an antenna port 112.

The power amplifier 104 may operate to amplify an input radio frequency ($RF_{in}$) signal in order to produce an amplified output radio frequency ($RF_{out}$) signal. The matching network 108 may operate to transform an impedance associated with an output of the power amplifier 104 to an impedance associated with an antenna coupled with the antenna port 112.

In operation, the power amplifier 104 may be controlled to provide varying levels of amplification to the RF signal. These varying amplification levels may change the desired impedance loading on the output of the power amplifier 104. This desired impedance loading, to be presented at an input to the matching network 108, may hereinafter be referred to as the source impedance. An impedance loading presented at an output to the matching network 108 that corresponds to the antenna, however, may stay relatively constant (with the exception of uncontrolled impedance variations that may occur through, e.g., shielding, etc.). This impedance loading presented at the output of the matching network may be referred to as the load impedance. Accordingly, it may be desirable for the matching network 108 to be capable of varying the impedance transformation throughout operation of the amplification circuitry 100.

The matching network 108 may be a series inductor, shunt capacitor type matching network (hereinafter "L-C network"). In particular, the matching network 108 may include an inductor 116 coupled in series with an output of the power amplifier 104. The matching network 108 may also include a capacitor structure 120 coupling a rail on which the inductor 116 is located to a ground. The inductor 116 may also be referred to as a series inductor, and the capacitor structure 120 may also be referred to as a shunt capacitor structure.

The capacitor structure 120 may include a capacitor 124 coupled in series with a switchable capacitor bank 128. The capacitor structure 120 may enable the matching network 108 to provide a variable impedance transformation with the use of relatively small, low-cost switches that are capable of handling high impedance mismatches without introducing undesirable signal distortion. In general, and as will be described below with respect to specific embodiments, providing this variable impedance transformation will be accomplished by implementing a selected combination of closed and open switches of the switchable capacitor bank 128 to provide a desired shunt capacitance of the capacitor structure 120. The desired shunt capacitance provided by the selected combination may be associated with a particular impedance transformation that corresponds to a particular transmit power range. Thus, the transmit power of the power amplifier 104 may be determined and an appropriate impedance transformation may then be provided by implementing a selected combination of closed and open switches of the switchable capacitor bank 128.

Figure 2:
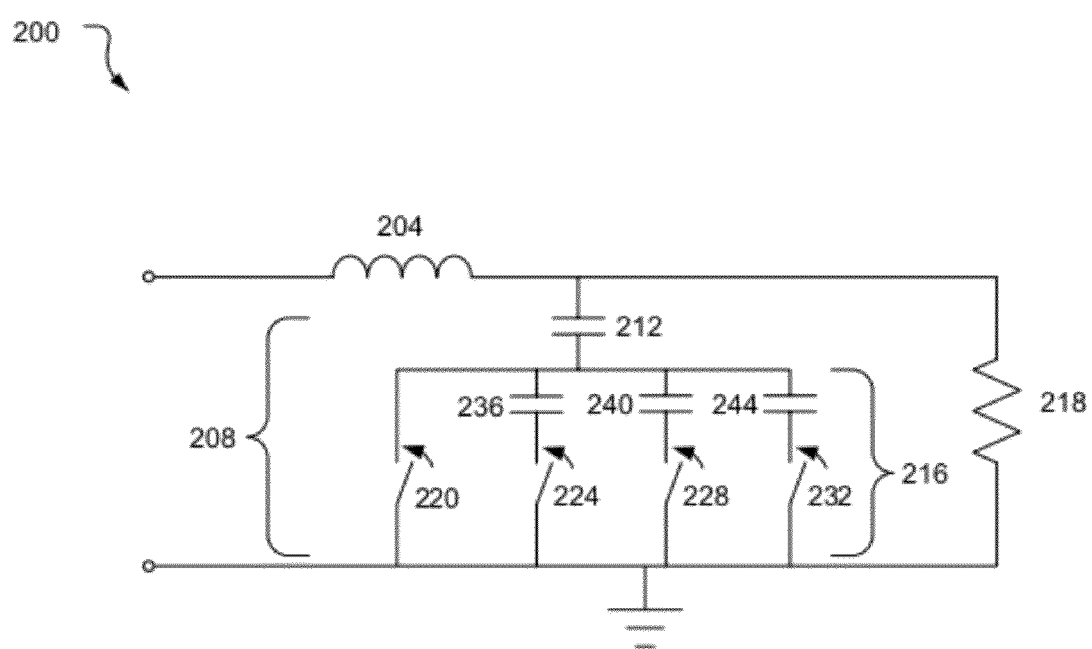
FIG. 2 illustrates a matching network in accordance with various embodiments.

FIG. 2 illustrates a matching network 200 in accordance with various embodiments. The matching network 200 may be similar to, and substantially interchangeable with, matching network 108.

The matching network 200 may include an inductor 204 and a capacitor structure 208 that includes a capacitor 212 and a switchable capacitor bank 216. A resistor 218 may represent a load impedance.

The switchable capacitor bank 216 may include four parallel lines, with each line including a switch, e.g., switch 220, switch 224, switch 228, and switch 232. Each switch may comprise one or more transistors, e.g., pseudomorphic high electron mobility transistors (pHEMTs). Each line of a subset of the parallel lines of the switchable capacitor bank 216 may also include a capacitor, e.g., capacitor 236, capacitor 240, and capacitor 244. Providing the capacitor 212 in series with the switchable capacitor bank 216 may reduce the size of the switches needed to hold back high line voltages that may be experienced on the rail on which the inductor 204 is located.

Consider, for example, a condition in which an antenna becomes shielded and the load impedance spikes, resulting in an antenna mismatch of 3:1. Were this antenna mismatch to occur with the amplification circuitry 100 providing a transmit power of 35 dBm, where dBm represents a power ratio in decibels (dB) referenced to one milliwatt (mW), the resulting voltage at the rail would be approximately 27 volts (V). Any switches of a switchable capacitor bank coupled directly with the rail would, therefore, need to be of sufficient size to hold off 27 V. The dimensions of such switches, e.g., number of transistors employed, would be significant. If any of the switches were of an insufficient size to hold off the 27 V, spurious signals would be introduced, causing non-linearities that reduce a quality of a transmitted RF signal. The capacitor structure 208, on the other hand, provides the capacitor 212 as an intermediary between the switchable capacitor bank 216 and the rail. As will be explained, this reduces the highest voltage seen by any of the switches of the switchable capacitor bank 216 and, therefore, allows a commensurate reduction in the size of the switches.

Figure 3:
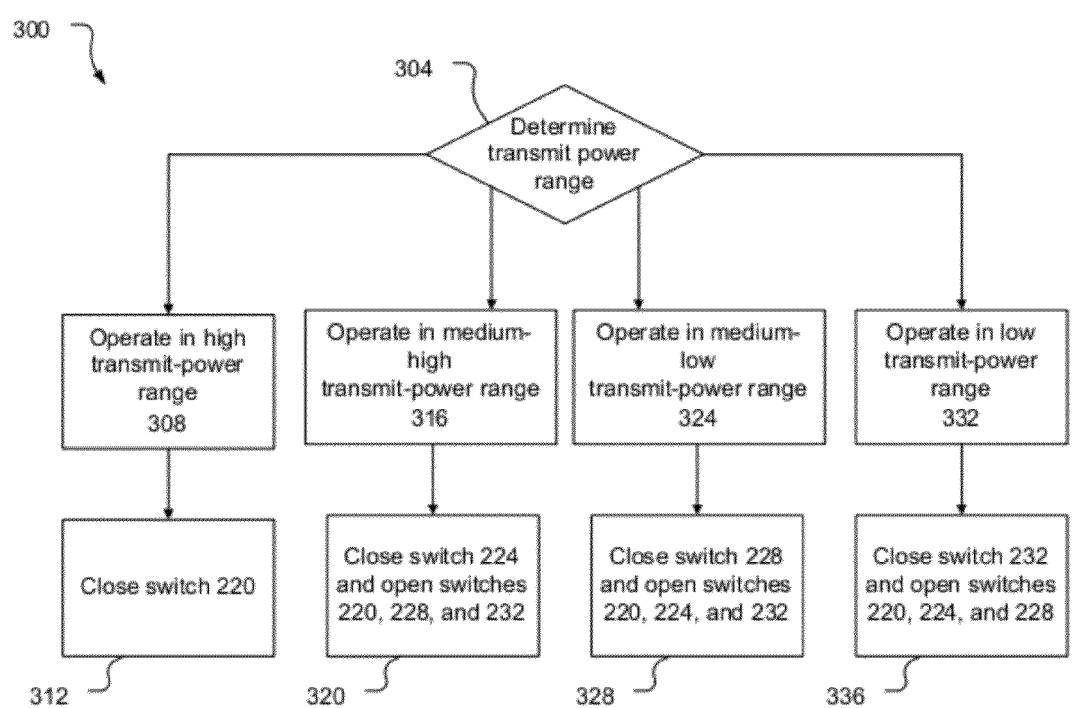
FIG. 3 illustrates a flowchart depicting operations of amplification circuitry in accordance with various embodiments.
Figure 4:
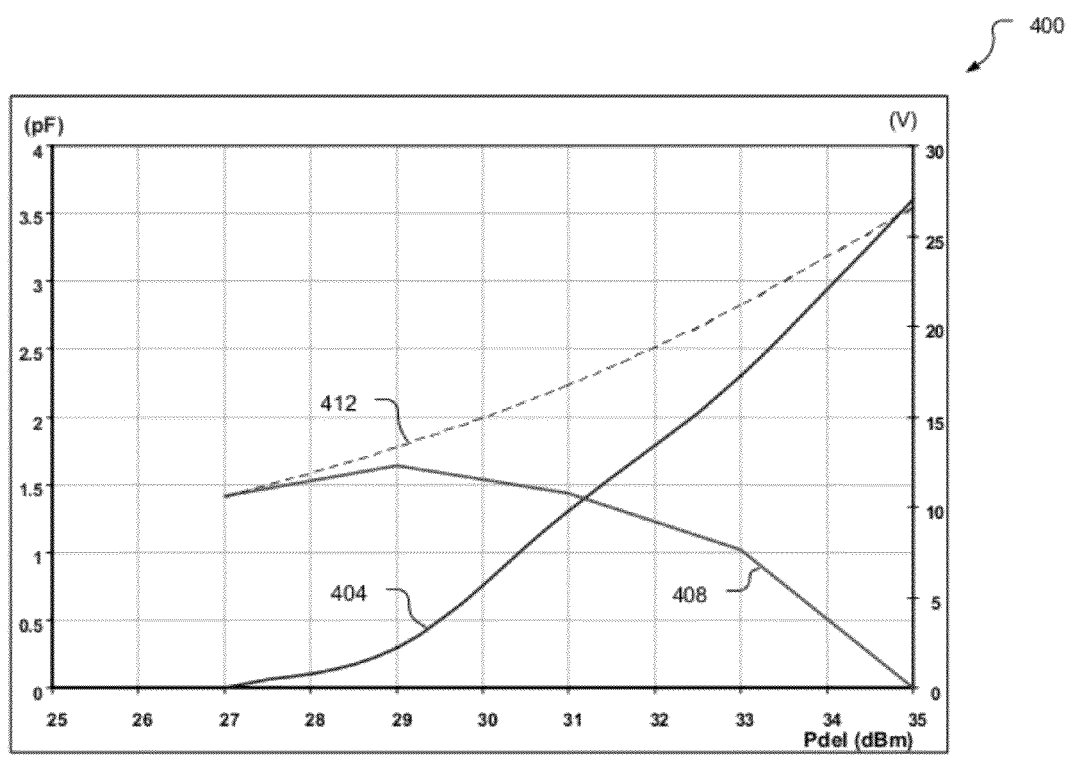
FIG. 4 illustrates a graph depicting representative capacitance and voltage values in accordance with various embodiments.

Operation of the amplification circuitry 100 employing matching network 200 may now be described with further reference to FIGS. 3 and 4. FIGS. 3 and 4 respectively illustrate a flowchart 300 depicting operations of the amplification circuitry 100 and a graph 400 depicting representative capacitance and voltage values in accordance with some embodiments. Line 404 represents an ideal shunt capacitance that the capacitor structure 208 may be desired to approximate, line 408 represents a voltage across the open switches of the switchable capacitor bank 216 with the ideal shunt capacitance, and line 412 represents the rail voltage for an antenna mismatch of 3:1.

At block 304, a controller coupled to the amplification circuitry 100 may determine the transmit-power range, from among a plurality (two or more) of transmit power ranges, within which to operate the amplification circuitry 100. This determination may be based on, e.g., an operating mode of a wireless communication device implementing the amplification circuitry 100.

At block 308, the controller may determine that the amplification circuitry 100 is to operate in a high transmit-power range, which may correspond to transmit powers, or $P_{del}$, from approximately 33 dBm to 35 dBm. For an L-C network, a highest shunt capacitance may be desired for a highest transmit power. Thus, the desired shunt capacitance may be approximately 3.6 picoFarads (pF) when $P_{del}$ is 35 dBm. The controller may then, at block 312, control the switchable capacitor bank 216 to close switch 220, in order to provide the highest shunt capacitance. In this state, the line-to-ground provided by the closed switch 220 may cause the voltage across the remaining switches, e.g., switches 224, 228, and 232, to be close to zero. Therefore, the opened or closed states of switches 224, 228, and 232 are irrelevant when switch 220 is closed.

At block 316, the controller may determine that the amplification circuitry 100 is to operate in a medium-high transmit-power range, which may correspond to transmit powers from approximately 31 dBm to 33 dBm. The controller may then, at block 320, control the switchable capacitor bank 216 to close switch 224 and open switches 220, 228, and 232. The capacitor 236 may be the largest of the three capacitors of the switchable capacitor bank 216, so that it effects the smallest reduction in the shunt capacitance. The voltage across the opened switches 220, 228, and 232 may be reduced from the rail voltage by a voltage division effected by capacitors 212 and 236. The rail voltage will itself be reduced due to the reduction in $P_{del}$ for the medium-high transmit power range.

At block 324, the controller may determine that the amplification circuitry 100 is to operate in a medium-low transmit-power range, which may correspond to transmit powers from approximately 29 dBm to 31 dBm. The controller may then, at block 328, control the switchable capacitor bank 216 to close switch 228 and open switches 220, 224, and 232. The capacitor 240 may be the second largest of the three capacitors of the switchable capacitor bank 216, so that it effects the second smallest reduction in the shunt capacitance.

At block 332, the controller may determine that the amplification circuitry 100 is to operate in a low transmit-power range, which may correspond to transmit powers from approximately 27 dBm to 29 dBm. The controller may then, at block 336, control the switchable capacitor bank 216 to close switch 232 and open switches 220, 224, and 228. The capacitor 244 may be the smallest of the three capacitors of the switchable capacitor bank 216, so it effects the largest reduction in the shunt capacitance. This may also translate to the open switches 220, 224, and 228 seeing the highest voltage when $P_{del}$ is approximately 29 dBm. However, as can be seen with reference to line 412, the highest voltage across the open switches of the capacitor structure 208 is significantly less, e.g., approximately 56% less, than the highest rail voltage.

As described, the switchable capacitor bank 216 includes four lines, three capacitors, and operates with only one switch closed at a time. However, various embodiments may provide a different number of lines, a different number of capacitors, and/or operate with more than one switch closed at a time. As can be appreciated, a wide range of shunt capacitance values may be achieved by varying these parameters. As the number of achievable shunt capacitance values increases, the shunt capacitance provided by capacitor structure 208 will approach the desired shunt capacitance represented by line 404.

Figure 5:
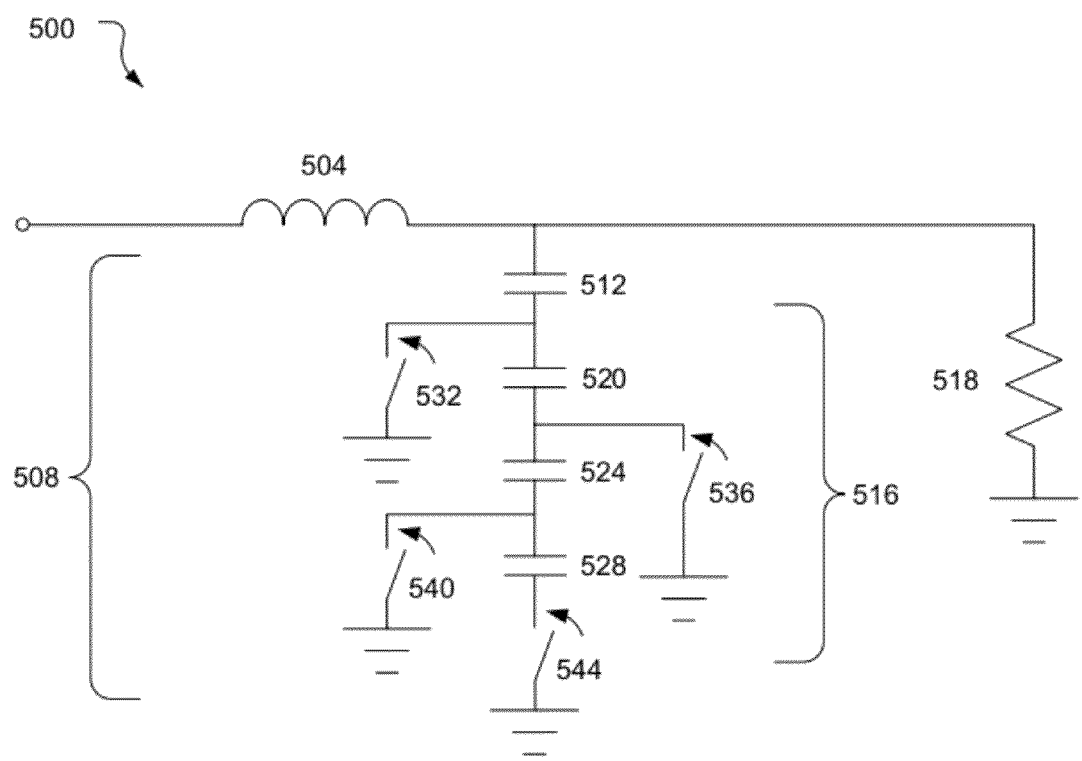
FIG. 5 illustrates a matching network in accordance with various embodiments.

FIG. 5 illustrates a matching network 500 in accordance with various embodiments. The matching network 500 may be similar to, and substantially interchangeable with, matching network 108.

The matching network 500 may include an inductor 504 and a capacitor structure 508 that includes a capacitor 512 coupled in series with a switchable capacitor bank 516. A resistor 518 may represent a load impedance.

The switchable capacitor bank 516 may include a number of capacitors, e.g., capacitors 520, 524, and 528, coupled in series with one another. The switchable capacitor bank 516 may also include a switch 532 to couple a node between capacitors 512 and 520 with the ground; a switch 536 to couple a node between capacitors 520 and 524 with the ground; a switch 540 to couple a node between capacitors 524 and 528 with a ground; and a switch 544 to couple a capacitor 528 with the ground.

Figure 6:
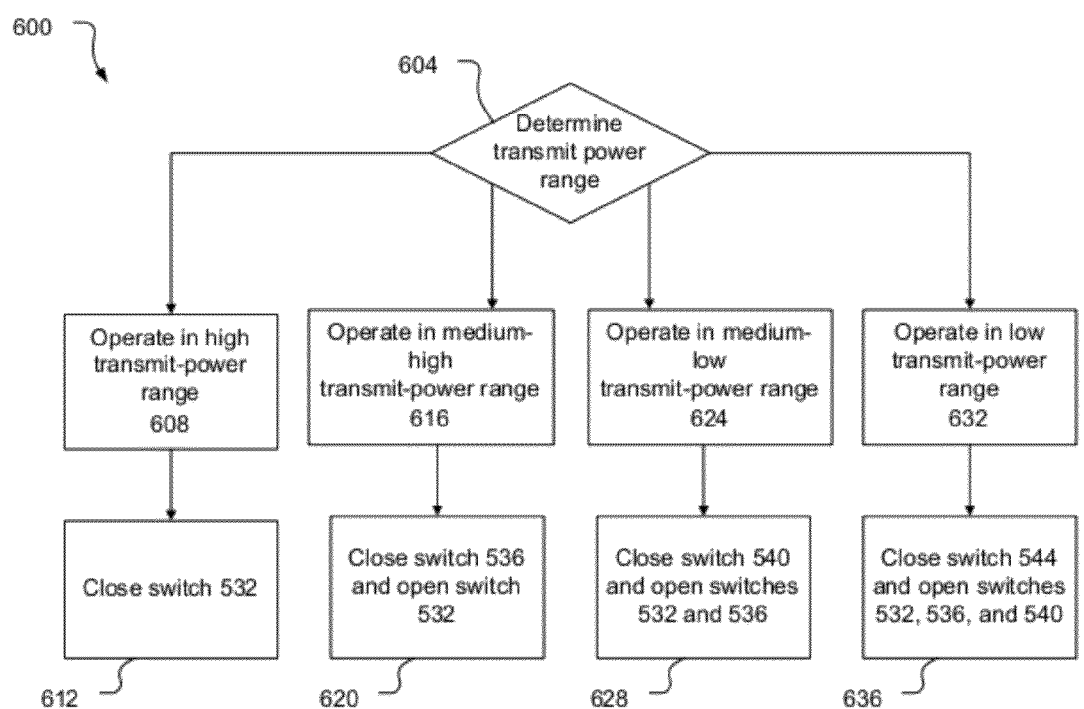
FIG. 6 illustrates a flowchart depicting operations of amplification circuitry in accordance with various embodiments.
Figure 7:
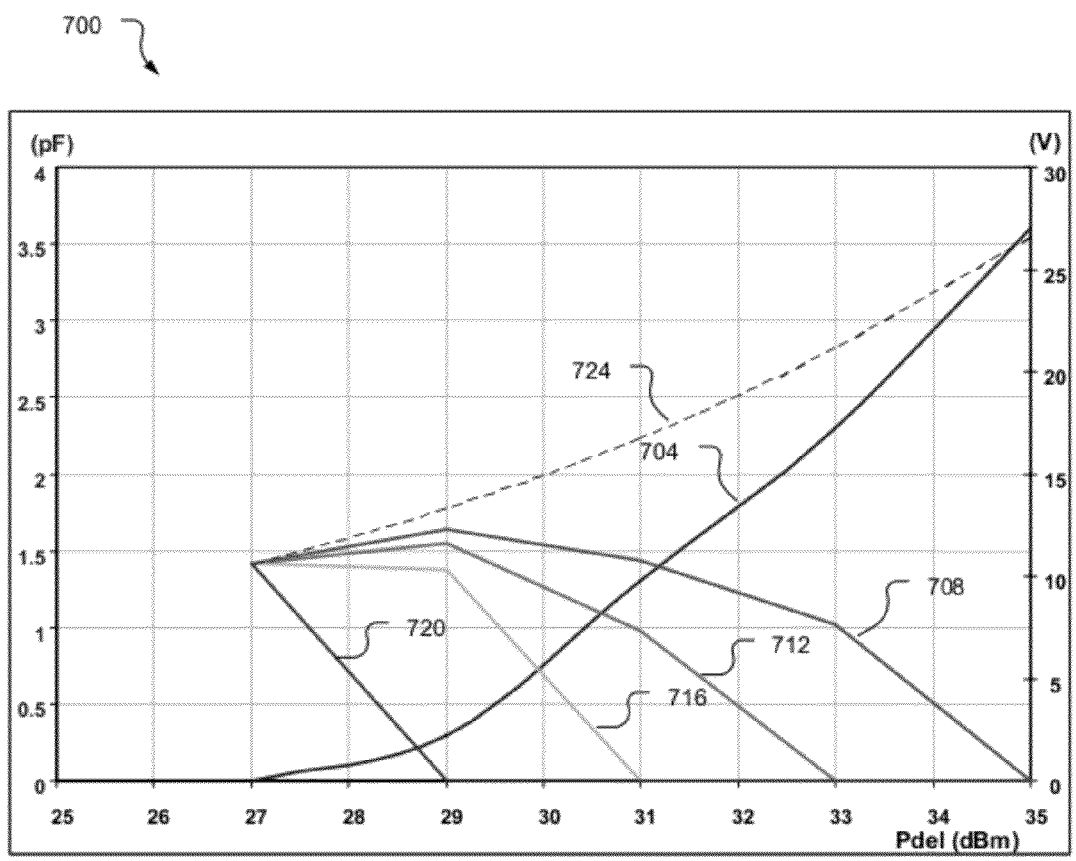
FIG. 7 illustrates a graph depicting representative capacitance and voltage values in accordance with various embodiments.

Operation of the amplification circuitry 100 employing matching network 500 may now be described with further reference to FIGS. 6 and 7. FIGS. 6 and 7 respectively illustrate a flowchart 600 depicting operations of the amplification circuitry 100 and a graph 700 depicting representative capacitance and voltage values in accordance with some embodiments. Line 704 represents an ideal shunt capacitance that the capacitor structure 508 may be desired to approximate; line 708 represents a voltage across switch 532; line 712 represents a voltage across switch 536; line 716 represents a voltage across switch 540; line 720 represents a voltage across switch 544; and line 724 represents a rail voltage, for an antenna mismatch of 3:1.

At block 604, a controller coupled to the amplification circuitry 100 may determine the transmit power range, from among a plurality (two or more) of transmit power ranges, within which to operate the amplification circuitry 100. As described above, this determination may be based on, e.g., an operating mode of a wireless communication device implementing the amplification circuitry 100.

At block 608, the controller may determine that the amplification circuitry 100 is to operate in a high transmit-power range. The controller may then, at block 612, control the switchable capacitor bank 516 to close switch 532. In this state, similar to the embodiment described above, the line-to-ground provided by the closed switch 532 may cause the voltage across the remaining switches, e.g., switches 536, 540, and 544, to be close to zero. Therefore, the opened or closed states of switches 536, 540, and 544 are irrelevant when switch 532 is closed.

At block 616, the controller may determine that the amplification circuitry 100 is to operate in a medium-high transmit-power range. The controller may then, at block 620, control the switchable capacitor bank 516 to close switch 536 and open switch 532. The voltage across the opened switch 532 may be reduced from the rail voltage by a voltage division effected by capacitors 512 and 520. The voltages across the switches 540 and 544 will still be zero. Therefore, the opened or closed states of switches 540 and 544 are irrelevant when switch 532 is open and switch 536 is closed.

At block 624, the controller may determine that the amplification circuitry 100 is to operate in medium-low transmit-power range. The controller may then, at block 628, control the switchable capacitor bank 516 to close switch 540 and open switches 532 and 536. The voltages across open switches 532 and 536 may be reduced from the rail voltage by a voltage division effected by capacitors 512, 520, and 524. The voltage across switch 544 will still be zero. Therefore, the opened or closed state of switch 544 is irrelevant when switches 532 and 536 are opened and switch 540 is closed.

At block 632, the controller may determine that the amplification circuitry 100 is to operate in a low transmit-power range. The controller may then, at block 636, control the switchable capacitor bank 516 to close switch 544 and open switches 532, 536, and 540. The voltage across open switches 532, 536, and 540 may be reduced from the rail voltage by a voltage division effected by capacitors 512, 520, 524, and 528.

As can be seen from the graph 700, the voltages seen by each of the four switches may be different. However, as can be seen with reference to line 724, the highest rail voltage is significantly greater than a voltage seen by any of the switches (line 708 representing voltage seen by switch 532).

Figure 8:
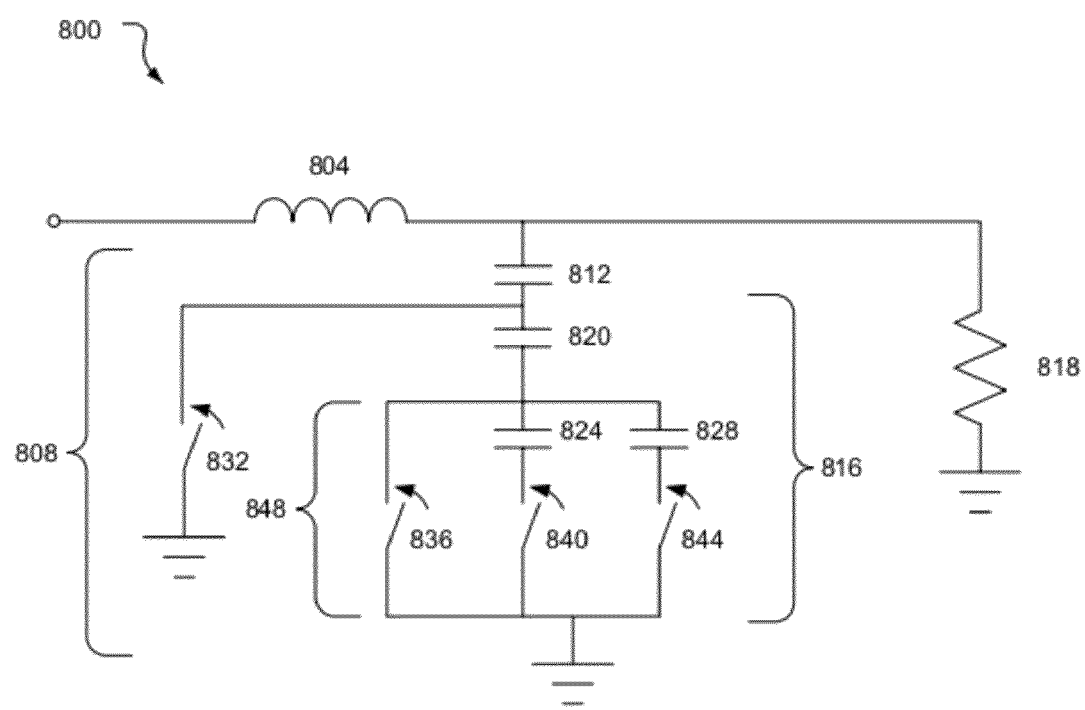
FIG. 8 illustrates a matching network in accordance with various embodiments.

FIG. 8 illustrates a matching network 800 in accordance with various embodiments. The matching network 800 may be similar to, and substantially interchangeable with, matching network 108.

The matching network 800 may include an inductor 804 and a capacitor structure 808 that includes a capacitor 812 coupled, in series, with a switchable capacitor bank 816. A resistor 818 may represent a load impedance.

The switchable capacitor bank 816 may include a number of capacitors, e.g., capacitors 820, 824, and 828. The switchable capacitor bank 816 may also include switches 832, 836, 840, and 844. The capacitor 820 may be coupled in series with a parallel structure 848 that includes the switches 836, 840, 844 and the capacitors 824 and 828 disposed on parallel lines as shown.

Figure 9:
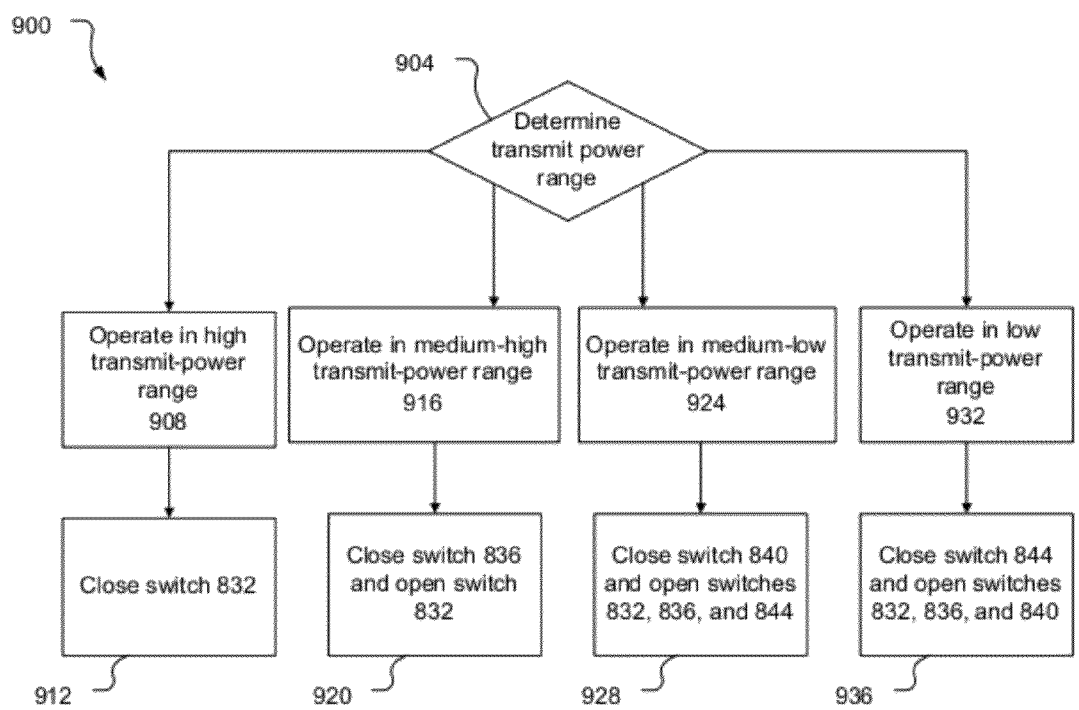
FIG. 9 illustrates a flowchart depicting operations of amplification circuitry in accordance with various embodiments.
Figure 10:
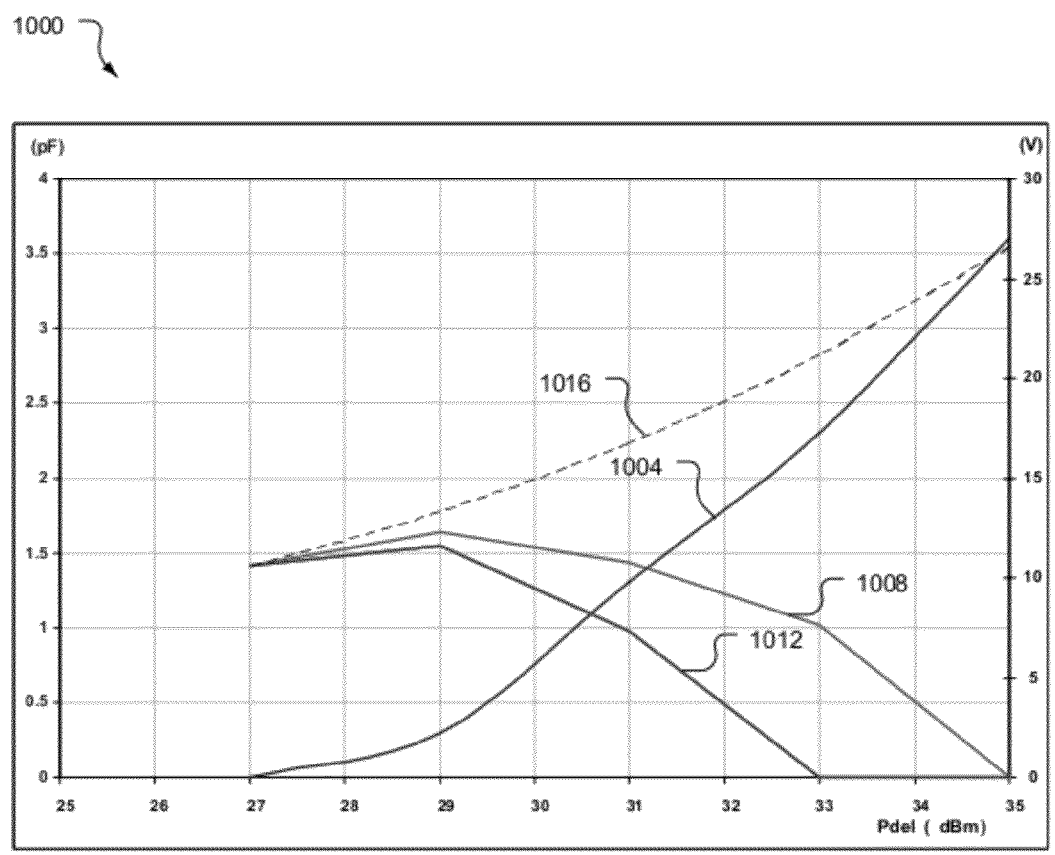
FIG. 10 illustrates a graph depicting representative capacitance and voltage values in accordance with various embodiments.

Operation of the amplification circuitry 100 employing matching network 800 may now be described with further reference to FIGS. 9 and 10. FIGS. 9 and 10 respectively illustrate a flowchart 900 depicting operations of the amplification circuitry 100 and a graph 1000 depicting representative capacitance and voltage values in accordance with some embodiments. Line 1004 represents an ideal shunt capacitance that the capacitor structure 808 may be desired to approximate; line 1008 represents a voltage across switch 832; line 1012 represents a voltage across switches 836, 840, and 844; and line 1016 represents a rail voltage, for an antenna mismatch of 3:1.

At block 904, a controller coupled to the amplification circuitry 100 may determine in which transmit-power range of a plurality of transmit power ranges to operate the amplification circuitry 100. As described above, this determination may be based on, e.g., an operating mode of a wireless communication device implementing the amplification circuitry 100.

At block 908, the controller may determine that the amplification circuitry 100 is to operate in a high transmit-power range. The controller may then, at block 912, control the switchable capacitor bank 816 to close switch 832. In this state, similar to the embodiment described above, the line-to-ground provided by the closed switch 832 may cause the voltage across the remaining switches, e.g., switches 836, 840, and 844, to be close to zero. Therefore, the opened or closed states of switches 836, 840, and 844 are irrelevant when switch 832 is closed At block 916, the controller may determine that the amplification circuitry 100 is to operate in a medium-high transmit-power range. The controller may then, at block 920, control the switchable capacitor bank 816 to close switch 836 and open switch 832. The voltages across the opened switch 832 may be reduced from the rail voltage by a voltage division effected by capacitors 812 and 820. The voltages across the switches 840 and 844 will still be zero due to the line-to-ground provided by closed switch 836. Therefore, the opened or closed states of switches 840 and 844 are irrelevant when switch 832 is opened and switch 836 is closed.

At block 924, the controller may determine that the amplification circuitry 100 is to operate in medium-low transmit-power range. The controller may then, at block 928, control the switchable capacitor bank 816 to close switch 840 and open switches 832, 836, and 844. The voltages across open switches 832, 836, and 844 may be reduced from the rail voltage by a voltage division effected by capacitors 812, 820 and 824.

At block 932, the controller may determine that the amplification circuitry 100 is to operate in a low transmit-power range. The controller may then, at block 936, control the switchable capacitor bank 816 to close switch 844 and open switches 832, 836, and 840. The voltages across open switches 832, 836, and 840 may be reduced from the rail voltage by a voltage division effected by capacitors 812, 820, and 828.

Figure 11:
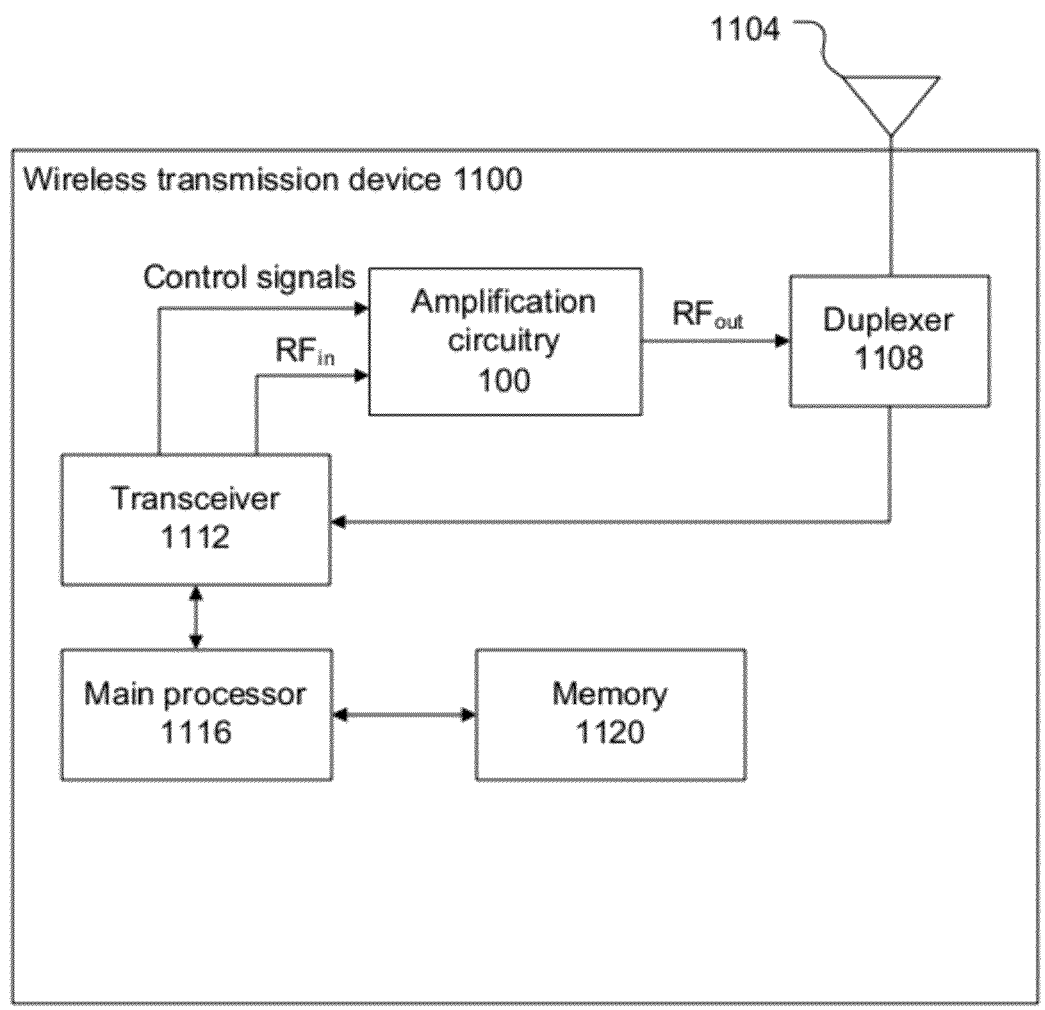
FIG. 11 illustrates a wireless transmission device implementing amplification circuitry in accordance with various embodiments.

The amplification circuitry 100 may be incorporated into any of a variety of apparatuses and systems. A block diagram of an exemplary wireless transmission device 1100 incorporating the amplification circuitry 100 is illustrated in FIG. 11. In addition to the amplification circuitry 100, the wireless transmission device 1100 may have an antenna structure 1104, a duplexer 1108, a transceiver 1112, a main processor 1116, and a memory 1120 coupled with each other at least as shown. While the wireless transmission device 1100 is shown with transmitting and receiving capabilities, other embodiments may include wireless transmission devices without receiving capabilities.

In various embodiments, the wireless transmission device 1100 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting RF signals.

The main processor 1116 may execute a basic operating system program, stored in the memory 1120, in order to control the overall operation of the wireless transmission device 1100. For example, the main processor 1116 may control the reception of signals and the transmission of signals by transceiver 1112. The main processor 1116 may be capable of executing other processes and programs resident in the memory 1120 and may move data into or out of memory 1120, as desired by an executing process.

The transceiver 1112 may receive outgoing data (e.g., voice data, web data, e-mail, signaling data, etc.) from the main processor 1116, may generate the $RF_{in}$ signal to represent the outgoing data, and provide the $RF_{in}$ signal to the amplification circuitry 100. The transceiver 1112 may also provide one or more control signals to control a switchable capacitor bank and/or a power amplifier of the amplification circuitry 100 as described herein.

The amplification circuitry 100 may amplify the $RF_{in}$ signal in accordance with the amplification mode determined by the control signals. The amplified $RF_{out}$ signal may be forwarded to the duplexer 1108 and then to the antenna structure 1104 for an over-the-air (OTA) transmission.

In a similar manner, the transceiver 1112 may receive an incoming OTA signal from the antenna structure 1104 through the duplexer 1108. The transceiver 1112 may process and send the incoming signal to the main processor 1116 for further processing.

In various embodiments, the antenna structure 1104 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless transmission device 1100 is given by way of example and that, for simplicity and clarity, only so much of the construction and operation of the wireless transmission device 1100 as is necessary for an understanding of the embodiments is shown and described. Various embodiments contemplate any suitable component or combination of components performing any suitable tasks in association with wireless transmission device 1100, according to particular needs. Moreover, it is understood that the wireless transmission device 1100 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
a power amplifier configured to amplify a radio frequency signal; and
a matching network coupled with the power amplifier and configured to transform a source impedance, which corresponds to an output of the power amplifier, to a load impedance, which corresponds to an antenna, the matching network including a series inductor and a shunt capacitor structure, the shunt capacitor structure having a first capacitor coupled in series with a switchable capacitor bank.

2. The circuit of claim 1, wherein the switchable capacitor bank includes one or more switches and one or more capacitors.

3. The circuit of claim 1, wherein the switchable capacitor bank includes a plurality of parallel lines, each of the parallel lines having a switch.

4. The circuit of claim 3, wherein each line of a first subset of the plurality of lines includes a capacitor.

5. The circuit of claim 4, wherein each capacitor of the switchable capacitor bank is a different size.

6. The circuit of claim 4, wherein a first line of the plurality of lines consists of a first switch.

7. The circuit of claim 6, wherein the first switch is closed to provide a first shunt capacitance; a second switch on a second line of the plurality of lines is closed, the first switch is open, a third switch on a third line of the plurality of lines is opened, and a fourth switch on a fourth line of the plurality of lines is opened to provide a second shunt capacitance; the third switch is closed and the first, second, and fourth switches are opened to provide a third shunt capacitance; and the fourth switch is closed and the first, second, and third switches are opened to provide a fourth shunt capacitance.

8. The circuit of claim 4, wherein the switchable capacitor bank further includes a second capacitor coupled in series with the first capacitor and further coupled, in series, with the plurality of parallel lines.

9. The circuit of claim 8, wherein a first switch, coupled with a node between the first and second capacitor, is closed to provide a first shunt capacitance; a second switch of a first line of the plurality of lines is opened and the first switch is closed to provide a second shunt capacitance; the first switch, the second switch, and a third switch on a second line of the plurality of lines are opened and a fourth switch on a third line of the plurality of lines is closed to provide a third shunt capacitance; and the first, second, and fourth switches are opened and the third switch is closed to provide a fourth shunt capacitance.

10. The circuit of claim 1, wherein the switchable capacitor bank includes:
    a second capacitor coupled in series with the first capacitor; and
    a first switch coupled with a ground and a first node that is between the first capacitor and the second capacitor.

11. The circuit of claim 10, wherein the switchable capacitor bank further includes:
    a third capacitor coupled in series with the second capacitor; and
    a second switch coupled with the ground and a second node that is between the second capacitor and the third capacitor.

12. The circuit of claim 10, wherein the switchable capacitor bank further includes:
    a fourth capacitor coupled in series with the third capacitor;
    a third switch coupled with a third node that is between the third capacitor and the fourth capacitor; and
    a fourth switch coupled with the fourth capacitor and the ground.

13. The circuit of claim 12, wherein the first switch is closed to provide a first shunt capacitance; the first switch is opened and the second switch is closed to provide a second shunt capacitance; the first and second switches are opened and the third switch is opened to provide a third shunt capacitance; and the first, second, and third switches are opened and the fourth switch is closed to provide a fourth shunt capacitance.

14. A system comprising:
    a transceiver configured to provide a radio frequency signal and a control signal; and
    amplification circuitry coupled with the transceiver and including:
        a power amplifier configured to receive and amplify the radio frequency signal; and
        a matching network configured to transform a source impedance, which corresponds to an output of the power amplifier, to a load impedance, which corresponds to an antenna, the matching network including a series inductor and a shunt capacitor structure, the shunt capacitor structure having a first capacitor coupled in series with a switchable capacitor bank that is configured to be controlled based at least in part on the control signal.

15. The system of claim 14, wherein the switchable capacitor bank includes one or more switches and one or more capacitors.

16. The system of claim 14, wherein the switchable capacitor bank includes a plurality of parallel lines, each of the parallel lines having a switch.

17. The system of claim 14, wherein the switchable capacitor bank includes a line having a plurality of capacitors coupled in series with one another and the switchable capacitor bank further includes a plurality of switches, with each of the plurality of switches coupled with the line and a ground.

18. The system of claim 14, wherein each line of a first subset of the plurality of lines includes a capacitor.

19. The system of claim 18, wherein each capacitor of the switchable capacitor bank is a different size.

20. A method comprising:
    controlling a power amplifier to provide a radio frequency (RF) signal with a first transmit power; and
    controlling a switchable capacitor bank of a matching network to transform a source impedance, which corresponds to an output of the power amplifier, to a load impedance, which corresponds to an antenna, the matching network further including a series inductor and a shunt capacitor structure, the shunt capacitor structure having a first capacitor coupled in series with the switchable capacitor bank.

21. The method of claim 20, wherein the switchable capacitor bank includes a plurality of lines with each line having a switch and a subset of the plurality of lines having a capacitor and said controlling the switchable capacitor bank further includes:
    closing one or more of the plurality of switches based at least in part on the first transmit power.

22. The method of claim 20, wherein the switchable capacitor bank includes a line having a plurality of capacitors coupled in series with one another and the switchable capacitor bank further includes a plurality of switches, with each of the plurality of switches coupled with the line and a ground and said controlling the switchable capacitor bank further includes:
    closing one or more of the plurality of switches based at least in part on the first transmit power.

23. The method of claim 20, wherein a first combination of closed and open switches of the switchable capacitor bank is associated with a first impedance transformation that corresponds to a first transmit power range and the method further comprises:
    determining the first transmit power is in the first transmit power range; and
    said controlling the switchable capacitor bank includes implementing the first combination of closed and open switches of the switchable capacitor bank based at least in part on said determining.

24. The method of claim 23, wherein a second combination of closed and open switches of the switchable capacitor bank is associated with a second impedance transformation that corresponds to a transmit power range and the method further comprises:
    controlling the power amplifier to provide the RF signal with a second transmit power;
    determining the second transmit power is in the second transmit power range;
    said controlling the switchable capacitor bank includes implementing the second combination of closed and open switches of the switchable capacitor bank based at least in part on said determining the second transmit power is in the second transmit power range.

* * * * *